(12) United States Patent
Aritome et al.

(10) Patent No.: US 7,715,234 B2
(45) Date of Patent: *May 11, 2010

(54) REDUCING EFFECTS OF PROGRAM DISTURB IN A MEMORY DEVICE

(75) Inventors: Seiichi Aritome, Boise, ID (US); Todd Marquart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/170,543

(22) Filed: Jul. 10, 2008

(65) Prior Publication Data

US 2008/0291730 A1 Nov. 27, 2008

Related U.S. Application Data

(63) Continuation of application No. 11/359,104, filed on Feb. 22, 2006, now Pat. No. 7,408,810.

(51) Int. Cl.
*G11C 16/04* (2006.01)

(52) U.S. Cl. .......................... 365/185.18; 365/185.17; 365/185.23

(58) Field of Classification Search ............ 365/185.23, 365/185.17, 185.18, 185.22, 185.02
See application file for complete search history.

(56) References Cited

U.S. PATENT DOCUMENTS

| | | | |
|---|---|---|---|
| 5,257,225 A | 10/1993 | Lee | |
| 5,357,463 A | 10/1994 | Kinney | |
| 5,424,993 A | 6/1995 | Lee et al. | |
| 5,511,022 A | 4/1996 | Yim et al. | |
| 5,528,547 A | 6/1996 | Aritome et al. | |
| 5,621,684 A | 4/1997 | Jung | |
| 5,677,873 A | 10/1997 | Choi et al. | |
| 5,677,875 A | 10/1997 | Yamagata et al. | |
| 5,680,350 A | 10/1997 | Lee | |
| 5,715,194 A | 2/1998 | Hu | |
| 5,768,287 A | 6/1998 | Norman et al. | |
| 5,771,346 A | 6/1998 | Norman et al. | |
| 5,907,855 A | 5/1999 | Norman | |
| 5,917,757 A | 6/1999 | Lee et al. | |
| 5,920,501 A | 7/1999 | Norman | |
| 5,930,168 A | 7/1999 | Roohparvar | |
| 5,959,892 A | 9/1999 | Lin | |
| 5,991,202 A | 11/1999 | Derhacobian | |
| 6,061,270 A | 5/2000 | Choi | |

(Continued)

OTHER PUBLICATIONS

S. Satoh et al., A Novel Gate-Offset NAND Cell (GOC-NAND) Technology Suitable for High-Density and Low-Voltage-Operation Flash Memories, Microelectronics Engineering Laboratory, Japan, IEEE, 1999, 4 pgs.

(Continued)

*Primary Examiner*—Gene N. Auduong
(74) *Attorney, Agent, or Firm*—Leffert Jay & Polglaze P.A.

(57) ABSTRACT

A selected word line that is coupled to cells for programming is biased with an initial programming voltage. The unselected word lines that are adjacent to the selected word line are biased at an initial $V_{pass}$. As the quantity of program/erase cycles on the memory device increases, the programming voltage required to successfully program the cells decreases incrementally. $V_{pass}$ tracks the decrease of the programming voltage.

19 Claims, 6 Drawing Sheets

U.S. PATENT DOCUMENTS

| | | | |
|---|---|---|---|
| 6,107,658 | A | 8/2000 | Itoh et al. |
| 6,157,575 | A | 12/2000 | Choi |
| 6,163,048 | A | 12/2000 | Hirose et al. |
| 6,240,016 | B1 | 5/2001 | Haddad |
| 6,240,023 | B1 | 5/2001 | Roohparvar |
| 6,370,062 | B2 | 4/2002 | Choi |
| 6,380,033 | B1 | 4/2002 | He et al. |
| 6,469,933 | B2 | 10/2002 | Choi et al. |
| 6,487,117 | B1 | 11/2002 | Choi et al. |
| 6,493,270 | B2 | 12/2002 | Chevallier |
| 6,498,752 | B1 | 12/2002 | Hsu et al. |
| 6,519,181 | B2 | 2/2003 | Jeong |
| 6,522,584 | B1 | 2/2003 | Chen et al. |
| 6,620,682 | B1 | 9/2003 | Lee |
| 6,657,915 | B2 | 12/2003 | Seo |
| 6,660,585 | B1 | 12/2003 | Lee et al. |
| 6,661,707 | B2 | 12/2003 | Choi et al. |
| 6,707,714 | B2 | 3/2004 | Kawamura |
| 6,798,694 | B2 | 9/2004 | Mihnea et al. |
| 6,925,011 | B2 | 8/2005 | Pekny et al. |
| 6,975,542 | B2 | 12/2005 | Roohparvar |
| 6,977,842 | B2 | 12/2005 | Nazarian |
| 6,982,905 | B2 | 1/2006 | Nguyen |
| 7,020,017 | B2 | 3/2006 | Chen et al. |
| 7,099,193 | B2 | 8/2006 | Futatsuyama |
| 7,120,059 | B2 | 10/2006 | Yeh |
| 7,161,833 | B2 | 1/2007 | Hemink |
| 7,212,435 | B2 * | 5/2007 | Rudeck et al. ......... 365/185.02 |
| 7,245,534 | B2 | 7/2007 | Goda et al. |
| 7,292,476 | B2 | 11/2007 | Goda et al. |
| 7,355,889 | B2 | 4/2008 | Hemink et al. |
| 7,394,693 | B2 | 7/2008 | Aritome |
| 7,408,810 | B2 * | 8/2008 | Aritome et al. ........ 365/185.23 |
| 7,440,321 | B2 | 10/2008 | Aritome |
| 7,471,565 | B2 | 12/2008 | Aritome |
| 7,499,330 | B2 | 3/2009 | Goda et al. |
| 7,561,469 | B2 | 7/2009 | Aritome |
| 2002/0060926 | A1 | 5/2002 | Choi |
| 2002/0075727 | A1 | 6/2002 | Jeong |
| 2002/0149958 | A1 | 10/2002 | Kunikiyo |
| 2004/0080980 | A1 | 4/2004 | Lee |
| 2004/0152262 | A1 | 8/2004 | Ichige et al. |
| 2004/0237000 | A1 | 11/2004 | Keays |
| 2005/0088890 | A1 | 4/2005 | Matsunaga |
| 2005/0226055 | A1 | 10/2005 | Guterman |
| 2005/0265097 | A1 | 12/2005 | Tanaka et al. |
| 2006/0002167 | A1 | 1/2006 | Rudeck et al. |
| 2006/0023502 | A1 | 2/2006 | Cernea et al. |
| 2006/0274583 | A1 | 12/2006 | Lutze |
| 2007/0047314 | A1 | 3/2007 | Goda et al. |
| 2007/0177429 | A1 | 8/2007 | Nagashima et al. |
| 2007/0236992 | A1 | 10/2007 | Oowada |
| 2007/0258286 | A1 | 11/2007 | Higashitani |
| 2008/0101126 | A1 | 5/2008 | Hemink |
| 2008/0253187 | A1 | 10/2008 | Aritome |
| 2008/0316827 | A1 | 12/2008 | Higashitani |
| 2009/0018211 | A1 | 1/2009 | Oromoto et al. |

OTHER PUBLICATIONS

S. Satoh et al., A Novel Isolation-Scaling Technology for NAND EEPROMs with the Minimized Program Disturbance, Microelectronics Engineering Laboratory, Japan, IEEE, 1997, IEDM 97-291, pp. 11.6.1-11.6.4.

T. Jung et al., "A 117-mm2 3.3-V Only 128-Mb Multilevel NAND Flash Memory for Mass Storage Applications" IEEE Journal of Solid-State Circuits, IEEE Inc., New York, NY, U.S., vol. 31, No. 11, Nov. 1996, pp. 1575-1583.

K. Suh et al., "A 3.3 V 32 Mb NAND Flash Memory with Incremental Step Pulse Programming Scheme" IEEE Journal of Solid-State Circuits, IEEE Inc., New York, NY, vol. 30, No. 11, Nov. 1995, pp. 1149-1156.

* cited by examiner

REDUCING EFFECTS OF PROGRAM DISTURB IN A MEMORY DEVICE

RELATED APPLICATION

This Application is a Continuation of U.S. application Ser. No. 11/359,104, titled "MINIMIZING EFFECTS OF PROGRAM DISTURB IN A MEMORY DEVICE," filed Feb. 22, 2006 now U.S. Pat. No. 7,408,810 (allowed), which is commonly assigned and incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

In the NOR array architecture, the floating gate memory cells of the memory array are arranged in a matrix. The gates of each floating gate memory cell of the array matrix are connected by rows to word select lines (word lines) and their drains are connected to column bitlines. The source of each floating gate memory cell is typically connected to a common source line. The NOR architecture floating gate memory array is accessed by a row decoder activating a row of floating gate memory cells by selecting the word line connected to their gates. The row of selected memory cells then place their stored data values on the column bitlines by flowing a differing current if in a programmed state or not programmed state from the connected source line to the connected column bitlines.

FIG. 1 shows a portion of a typical prior art NAND flash memory array. The selected word line 100 for the flash memory cells being programmed is typically biased by programming pulses that start at a voltage of around 16V and may incrementally increase to more than 20V. The selected word line 100 of the cells 101-103 to be programmed is biased at 19V. The unselected word lines for the remaining cells are biased at $V_{pass}$. This is typically in an approximate range of 9-10V. The bit lines of the cells 101-103 to be programmed are biased at 0V while the inhibited bit lines are biased at $V_{CC}$.

As NAND flash memory is scaled, parasitic capacitance coupling between the selected word line and adjacent word lines becomes problematic. Because of the parasitic coupling, the neighboring cells are more prone to program disturb than the other cells that also share the common bit line with the cells being programmed. This causes the cells on neighboring word lines to experience program disturb.

The program disturb condition has two operation modes: boosting mode and $V_{pass}$ mode. During the boosting mode, the cell's channel is at a positive boosting voltage (e.g., 6V) with respect to the gate and the gate is at $V_{pgm}$ (e.g., 19V). During the $V_{pass}$ mode, the cell's channel is at ground and the gate is at $V_{pass}$ (e.g., 10V). In FIG. 1, the cells 120, 121 on the selected word line 100 and inhibited bit lines are influenced by boosting mode program disturb. The neighboring cells 110-118 that are coupled to the enabled bit lines experience $V_{pass}$ mode program disturb.

Program disturb is degraded as the number of program/erase cycles increase. As the quantity of program/erase cycles increase, the voltage difference between the programmed state and the erased state narrows. This makes the affected cells more susceptible to over-programming as the threshold voltage, $V_t$, narrows. This is a result of the program disturb causing an increasing threshold voltage as the quantity of program/erase cycles increase.

For the reasons stated above, and for other reasons stated below which will become apparent to those skilled in the art upon reading and understanding the present specification, there is a need in the art for a way to minimize the effects of program disturb in a memory device.

DETAILED DESCRIPTION

Figure 8:
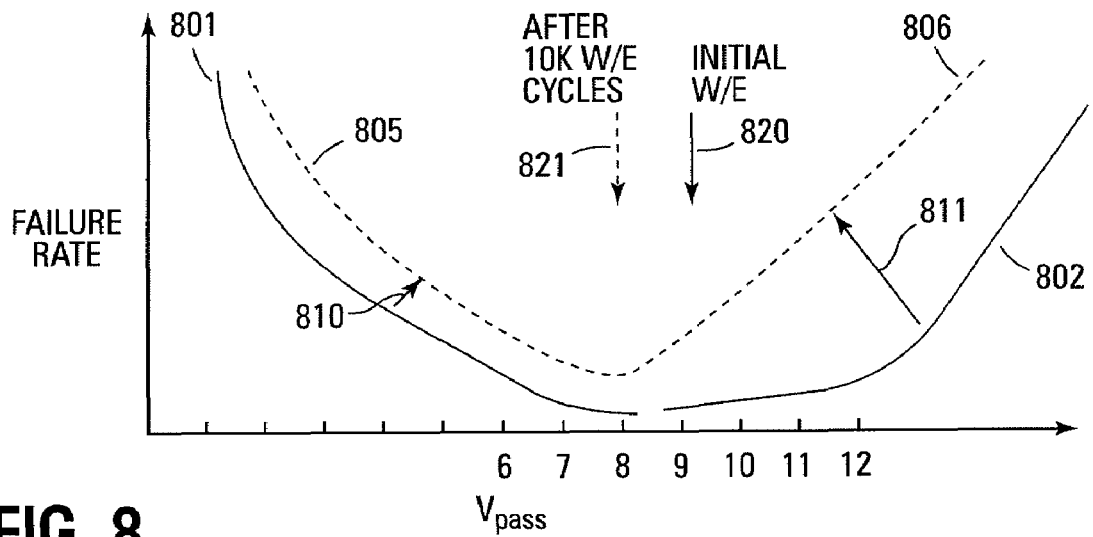
FIG. 8 shows a plot of failure rate of an arbitrary unit versus $V_{pass}$ voltage.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 8 illustrates a plot of failure rate versus $V_{pass}$ voltage. The failure rate is for an arbitrary unit.

This plot shows an initial $V_{pgm}$ boosting mode 801 with the failure rate decreasing as $V_{pass}$ increases until a predetermined optimized $V_{pass}$ is reached. In the illustrated plot, the predetermined optimized $V_{pass}$ is approximately 9.0V. An initial $V_{pass}$ mode 802 plot shows that as $V_{pass}$ increases from 9.0V, the failure rate of the arbitrary unit increases again.

After 10 k write/erase cycles, the $V_{pass}$ mode has degraded 811 considerably as compared with the $V_{pgm}$ boosting mode degradation 810. The optimal $V_{pass}$ voltage has also changed from the $V_{pass}$ 820 at the initial write/erase cycling of approximately 9.0V to approximately 8.0V after the 10 k write/erase cycles 821.

Figure 9:
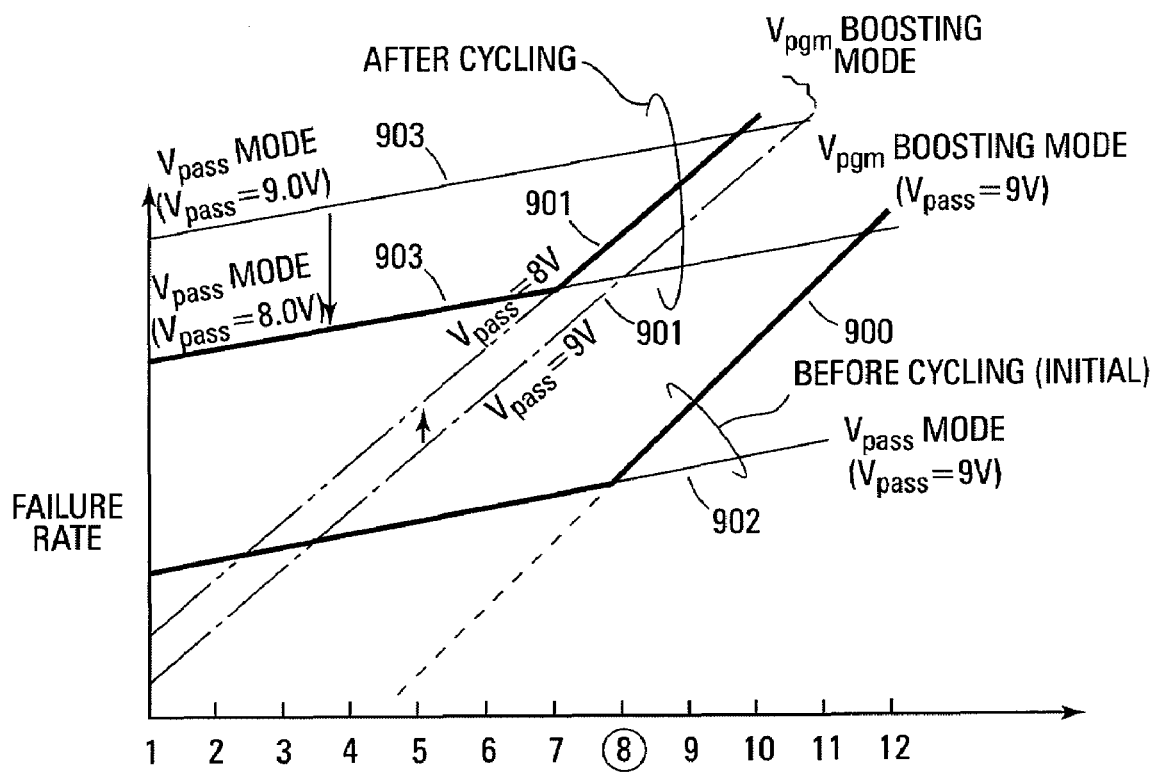
FIG. 9 shows a plot of failure rate versus partial page program cycle optimized at eight partial page cycles.

FIG. 9 illustrates a plot of failure rate for an arbitrary unit versus partial page program cycle that is optimized at eight partial page cycles. This graph shows the plots for $V_{pgm}$ boosting before (initial) cycling 900, $V_{pass}$ mode before cycling 902, $V_{pgm}$ boosting mode after 10 k cycling 901, and $V_{pass}$ mode after 10 k cycling 903. This shows that in order to decrease program disturb failure rate, $V_{pass}$ needs to be reduced as write/erase cycles increase. The lower bolded lines 900, 902 show the total failure rate before cycling and the upper bolded lines 901, 903 show total failure rate after 10 k cycling. In this case, $V_{pass}$ is changed from 9V to 8V.

Figure 10:
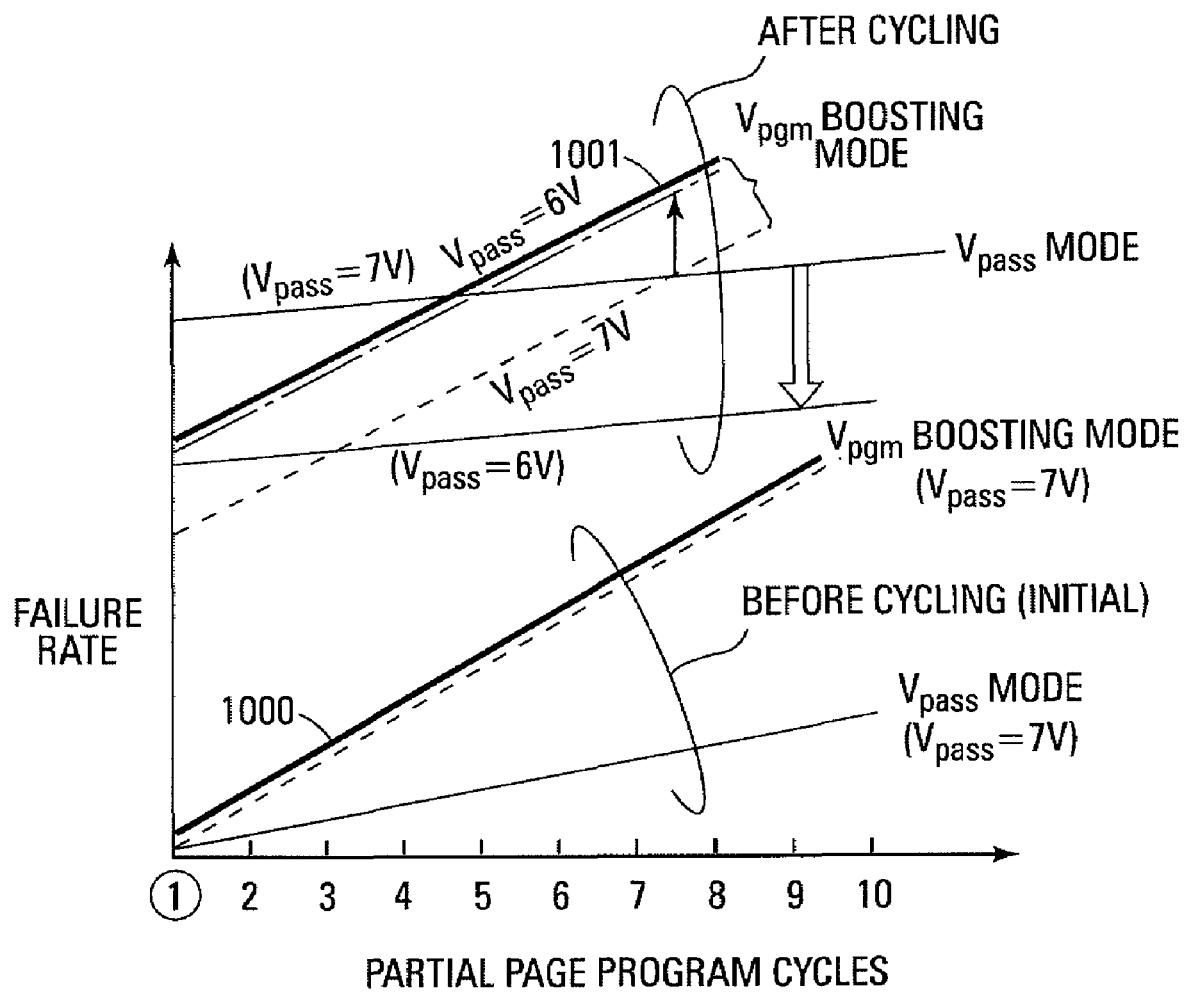
FIG. 10 shows a plot of failure rate versus partial page program cycle optimized at one partial page cycle.

FIG. 10 illustrates a plot of failure rate for an arbitrary unit versus partial page program cycle that is optimized at one partial page cycle. This plot shows the $V_{pgm}$ boosting mode ($V_{pass}$=7V) at one partial page program cycle optimization. Also shown is the $V_{pgm}$ boosting mode ($V_{pass}$=6V) at one partial page program cycle optimization.

Figure 1:
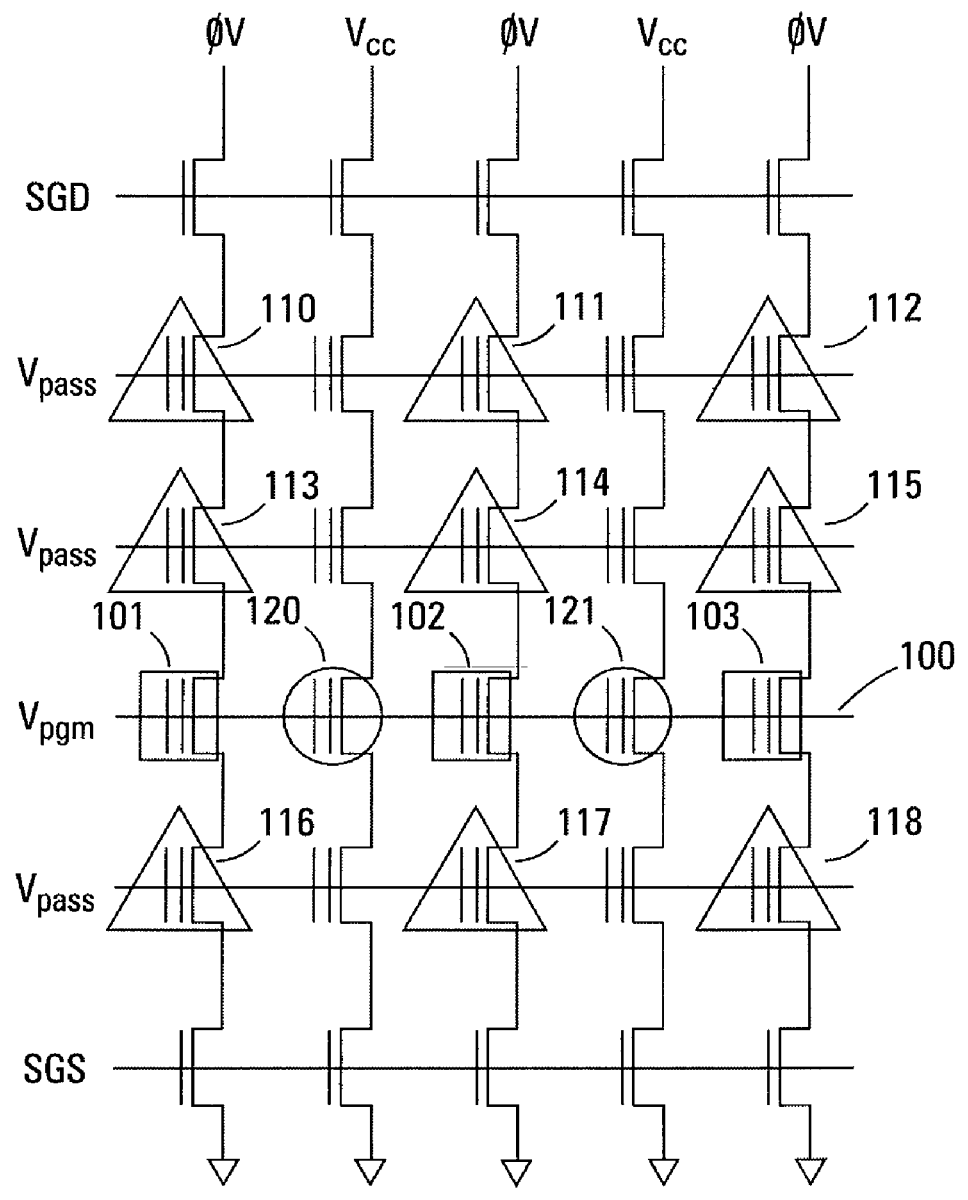
FIG. 1 shows a typical prior art NAND architecture memory array with word line biasing.
Figure 2:
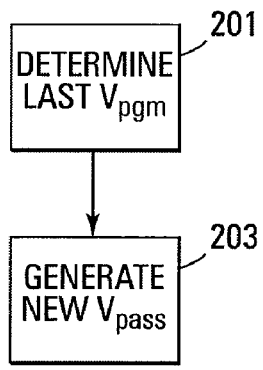
FIG. 2 shows a flowchart of one embodiment of a method of the present invention for adjusting $V_{pass}$.

FIG. 2 illustrates a flowchart of one embodiment of a method for reducing the effects of program disturb by automatically adjusting $V_{pass}$. This method is comprised of first determining the last program voltage 201, $V_{pgm}$, that was able to successfully program memory cells.

As is well known in the art, a non-volatile memory cell is programmed by a series of incrementally increasing voltage pulses on the selected word line. The pulses typically start at an initial voltage (e.g., 16V) and increase by a set amount (e.g., 1V) until the desired cells are either programmed or an error occurs due to the cell or cells not being programmable.

In one embodiment of the method of FIG. 2, $V_{pass}$ is based on the last $V_{pgm}$ voltage that successfully programmed the selected cell or cells. In an alternate embodiment, after an entire memory block has been programmed, $V_{pass}$ is based on the average $V_{pgm}$ that was used throughout the memory block to successfully program the cells. The voltage that biases the unselected word lines (i.e., $V_{pass}$) is then determined 203 in response to last or average $V_{pgm}$ just determined.

In one embodiment, $V_{pass}$ tracks $V_{pgm}$ as a fixed ratio or percentage of $V_{pgm}$. For example, $V_{pass}$=C*$V_{pgm}$, where the constant C is approximately 0.5. Alternate embodiments can use other values for the constant C.

Figure 3:
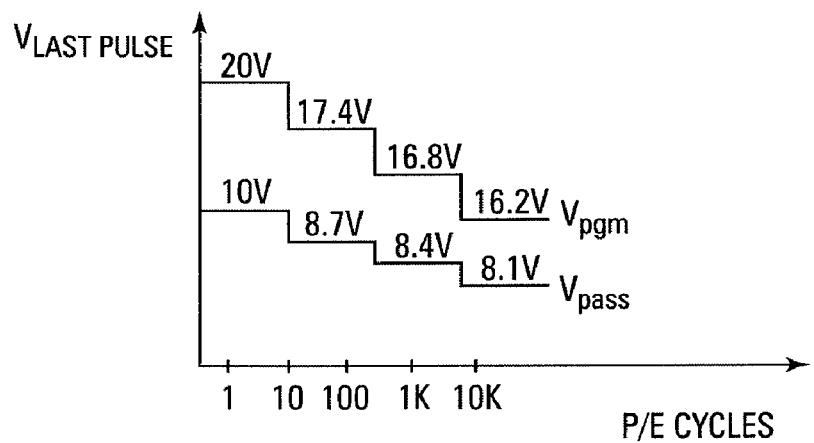
FIG. 3 shows a plot of last pulse voltage versus the quantity of program/erase cycles in accordance with the method of FIG. 2.

FIG. 3 illustrates a plot of the voltage of the last or average $V_{pgm}$ pulse versus the quantity of program/erase cycles. The plot shows that as the quantity of program/erase cycles increases, the voltage required to program the cells decreases. This is due to the build-up of electrons in the tunnel oxide between the substrate and the floating gate or trap layer. As the electrons in this layer increase over an increasing quantity of cycles, the voltage required on the gate to force the electrons to tunnel through the tunnel dielectric is reduced.

The $V_{pass}$ bias that tracks $V_{pgm}$ as discussed previously is shown below the $V_{pgm}$ waveform. This shows $V_{pass}$ decreasing as 50% of $V_{pgm}$. The values illustrated in FIG. 3 are for purposes of illustration only. The voltage levels and the level of $V_{pass}$ as related to $V_{pgm}$ are not limited by the present invention.

Figure 4:
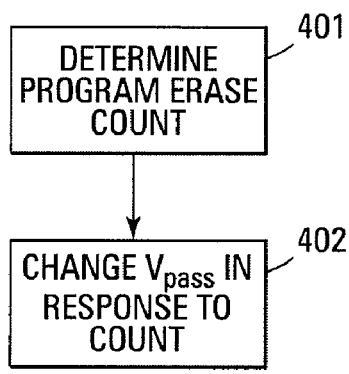
FIG. 4 shows a flowchart of an alternate embodiment of a method of the present invention for adjusting $V_{pass}$.

FIG. 4 illustrates a flowchart of an alternate embodiment of a method of the present invention for programming memory cells in a flash memory array. This embodiment bases $V_{pass}$ on a count of program/erase cycle.

Figure 5:
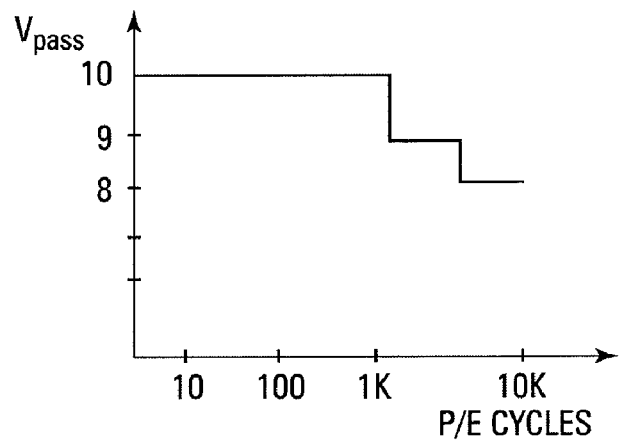
FIG. 5 shows a plot of $V_{pass}$ versus the quantity of program/erase cycles in accordance with the method of FIG. 4.

Initially, the count of program/erase cycles is determined 401. $V_{pass}$ is then updated in response to this count. As the plot of FIG. 5 shows, as the quantity of program/erase cycles increases, the voltage level of $V_{pass}$ decreases. In one embodiment, $V_{pass}$ starts at 10V for a predetermined quantity of cycles (e.g., 1,000 cycles). $V_{pass}$ is then reduced a predetermined voltage (e.g., 1V) for the next quantity of cycles (e.g., 7,000 cycles). $V_{pass}$ is again reduced by the predetermined voltage after the next quantity of cycles.

As in previous embodiments, the voltages and program/erase cycles illustrated in FIG. 5 are for purposes of illustration only. The present invention is not limited to any one predetermined voltage reduction nor to any one quantity of cycles between $V_{pass}$ reductions.

Figure 6:
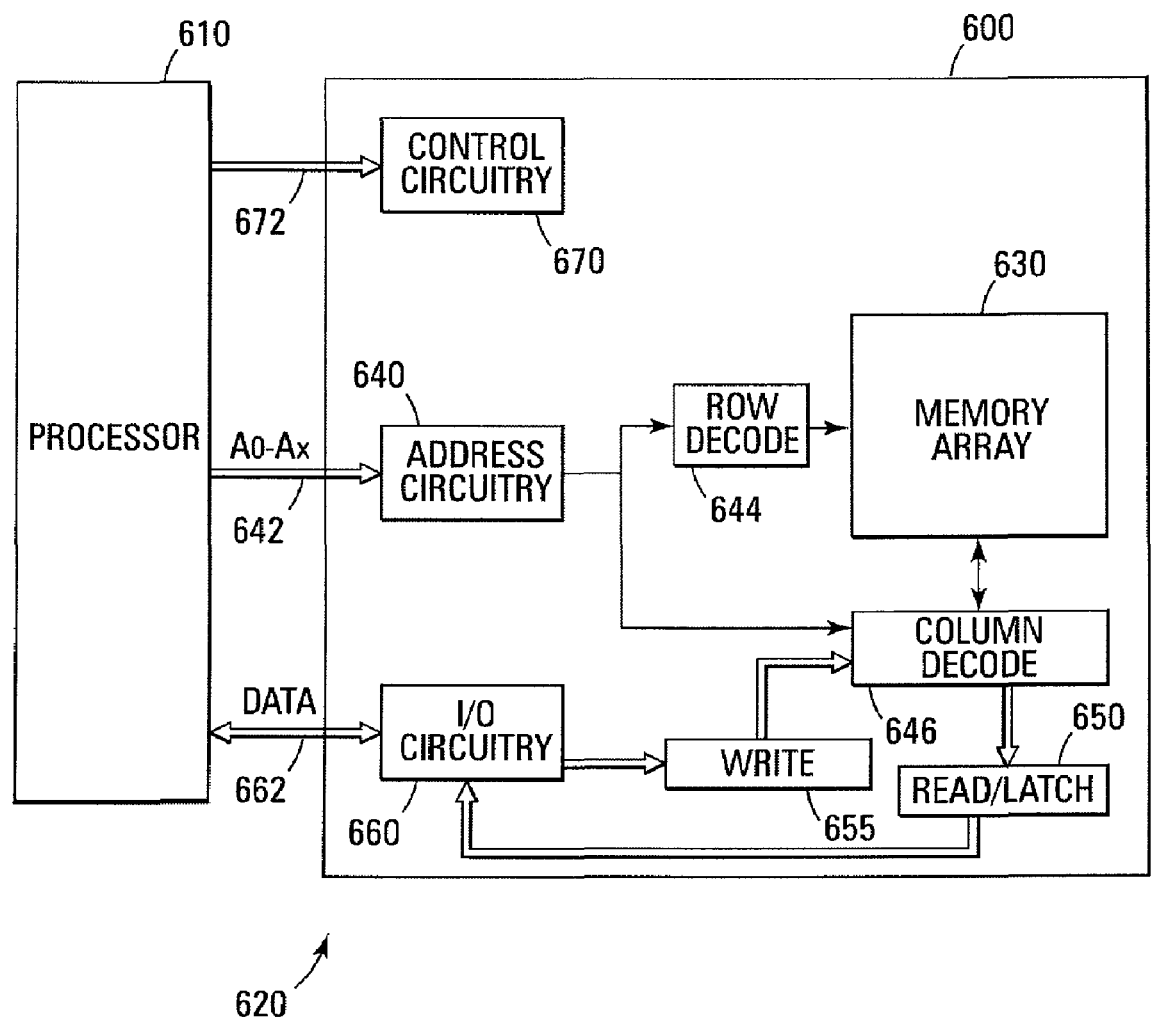
FIG. 6 shows a block diagram for one embodiment of a memory system of the present invention.

FIG. 6 illustrates a functional block diagram of a memory device 600 that can incorporate the non-volatile memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of flash memory cells 630 or some other type of non-volatile memory cells. The memory array 630 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense amplifier/buffer circuitry 650. The sense amplifier/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller. The control circuitry 670 of the present invention, in one embodiment, is responsible for executing the method of the present invention for controlling the values of the selected word line programming voltage and the voltages on the unselected word lines.

The flash memory device illustrated in FIG. 6 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 7:
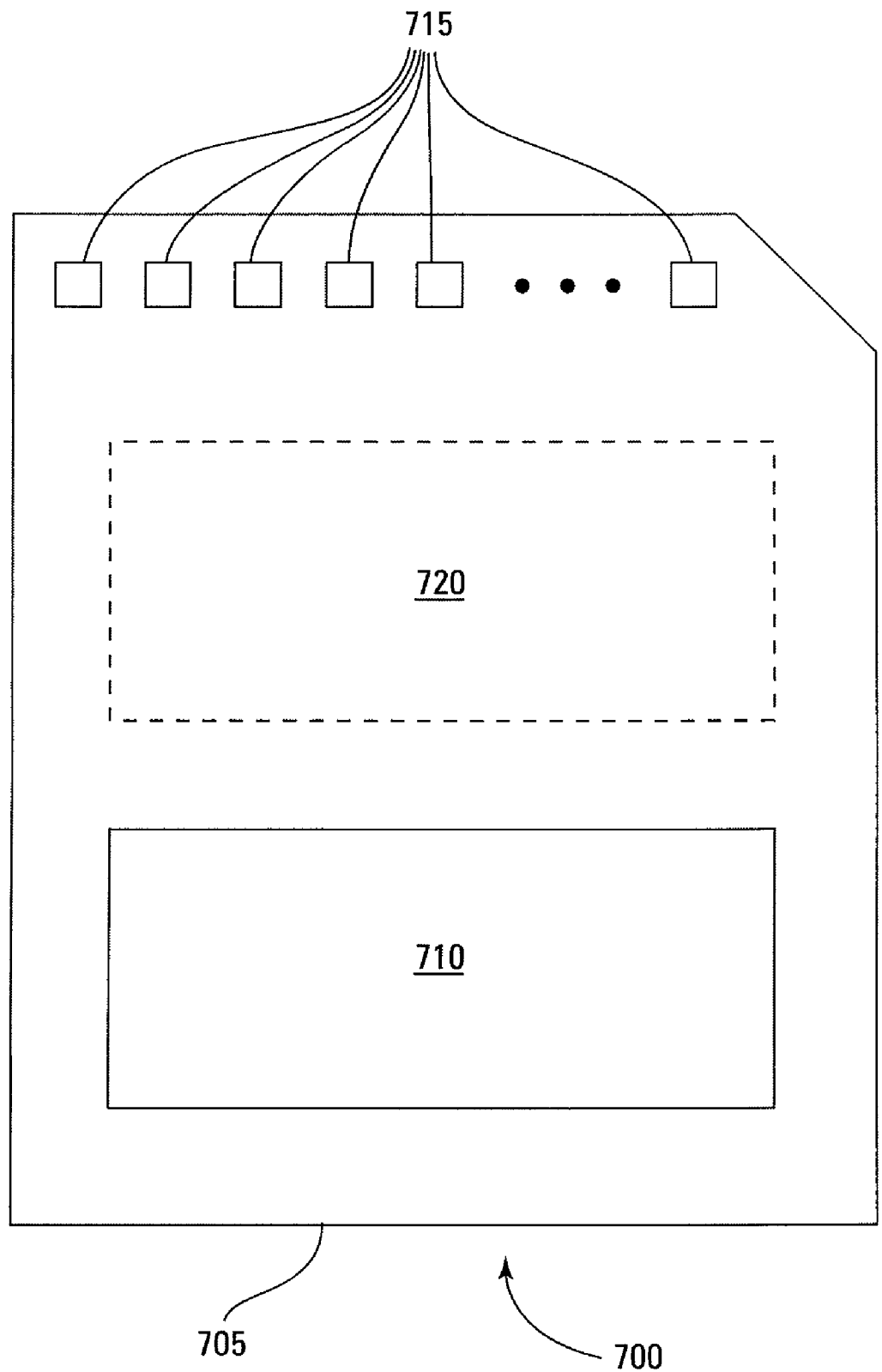
FIG. 7 shows a block diagram for one embodiment of a memory module of the present invention.

FIG. 7 is an illustration of a memory module 700 that incorporates the memory cell embodiments as discussed previously. Although memory module 700 is illustrated as a memory card, the concepts discussed with reference to memory module 700 are applicable to other types of removable or portable memory, e.g., USB flash drives. In addition, although one example form factor is depicted in FIG. 7, these concepts are applicable to other form factors as well.

Memory module 700 includes a housing 705 to enclose one or more memory devices 710 of the present invention. The housing 705 includes one or more contacts 715 for communication with a host device. Examples of host devices include digital cameras, digital recording and playback devices, PDAs, personal computers, memory card readers, interface hubs and the like. For some embodiment, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on COMPACTFLASH memory cards licensed by SANDISK Corporation, MEMORY STICK memory cards licensed by SONY Corporation, SD SECURE DIGITAL memory cards licensed by TOSHIBA Corporation and the like. In general, however, contacts 715 provide an interface for passing control, address and/or data signals between the memory module 700 and a host having compatible receptors for the contacts 715.

The memory module 700 may optionally include additional circuitry 720. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710. The additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

In summary, the embodiments of the present invention provide a way to reduce or eliminate the over-programming of memory cells due to degradation of $V_{pass}$ disturb. By automatically adjusting the $V_{pass}$ bias based on tracking the $V_{pgm}$ voltage, $V_{pass}$ can be reduced as $V_{pgm}$ is reduced as program/erase cycles increase. Alternatively, $V_{pass}$ can be decreased based on a program/erase cycle count.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for adjusting an unselected memory cell bias voltage in a memory device having a memory array comprising a plurality of memory cells, the method comprising:
   generating an adjusted selected memory cell bias voltage from an initial selected memory cell bias voltage;
   generating an adjusted unselected memory cell bias voltage, from an initial unselected memory cell bias voltage, in response to the adjusted selected memory cell bias voltage;
   biasing a selected memory cell at the adjusted selected memory cell bias voltage; and
   biasing unselected memory cells at the adjusted unselected memory cell bias voltage.

2. The method of claim 1 wherein the adjusted unselected memory cell bias voltage remains at substantially fifty percent of the adjusted selected memory cell bias voltage.

3. The method of claim 1 wherein the initial selected memory cell bias voltage is in a range of 16-20V and the initial unselected memory cell bias voltage is in a range of 9-10V.

4. The method of claim 1 wherein generating the adjusted selected memory cell bias voltage comprises decreasing the bias voltage in response to an increasing quantity of program/erase cycles for the memory array.

5. A method for programming a memory block in a non-volatile memory device, the method comprising:
   generating an initial selected memory cell bias that is applied to a set of memory cells of the memory block;
   generating an initial unselected memory cell bias that is applied to remaining memory cells of the memory block;
   determining a quantity of program/erase cycles issued to the memory block;
   decreasing the initial selected memory cell bias by a voltage in response to an increasing quantity of program/erase cycles; and decreasing the initial unselected memory cell bias in response to a decreasing initial selected memory cell bias.

6. The method of claim 5 wherein decreasing the initial unselected memory cell bias comprises averaging program voltages that successfully program the memory block during the quantity of program/erase cycles.

7. The method of claim 5 wherein decreasing the initial selected memory cell bias comprises decreasing the initial selected memory cell bias in response to the quantity of program/erase cycles.

8. The method of claim 5 and further including biasing selected memory block bit lines at ground potential and biasing unselected memory block bit lines at $V_{CC}$.

9. A method for adjusting an unselected memory cell bias voltage in a memory device comprising a plurality of memory cells organized into memory blocks, the method comprising:
   determining a quantity of program/erase cycles performed on a first memory block; and
   adjusting the unselected memory cell bias, from an initial unselected memory cell bias, in response to the count.

10. The method of claim 9 and further comprising:
    biasing a selected memory cell with an initial selected memory cell bias; and
    decreasing the initial selected memory cell bias incrementally in response to the quantity of program/erase cycles.

11. The method of claim 9 wherein adjusting the unselected memory cell bias comprises reducing the bias in increments of 1.0V in response to the count.

12. A non-volatile memory device comprising:
    an array of non-volatile memory cells arranged in memory blocks; and
    control circuitry coupled to the array of non-volatile memory cells and configured to program at least a first memory block, the control circuit configured to generate an initial programming voltage and an initial unselected memory cell voltage and decrease the programming voltage and the unselected memory cell voltage in response to a quantity of program/erase cycles such that the unselected memory cell voltage is substantially close to a predetermined percentage of the programming voltage.

13. The device of claim 12 wherein the array of non-volatile memory cells is arranged in a NAND architecture.

14. The device of claim 12 wherein the array of non-volatile memory cells is arranged in a NOR architecture.

15. A non-volatile memory device comprising:
    an array of non-volatile memory cells; and
    control circuitry coupled to the array of non-volatile memory cells and configured to adjust a $V_{pass}$ voltage in the array of non-volatile memory cells by generating an initial $V_{pass}$, determining a quantity of program/erase cycles executed on the array, and decreasing $V_{pass}$ in response to the quantity.

16. The device of claim 15 wherein the control circuitry is further adapted to decrease $V_{pass}$ by 1.0V each time the quantity reaches a predetermined quantity of program/erase cycles.

17. The device of claim 15 and further comprising an external processor coupled to the array of non-volatile memory cells, thus forming a memory system.

18. The system of claim 17 wherein the control circuitry is further adapted to control biasing of array bit lines such that bit lines coupled to cells to be programmed are biased with 0V.

19. The system of claim 18 wherein the control circuitry is further adapted to control biasing of the bit lines such that bit lines not coupled to the cells to be programmed are biased with $V_{cc}$.

* * * * *